US012651889B2

(12) United States Patent
Moser et al.

(10) Patent No.: US 12,651,889 B2
(45) Date of Patent: Jun. 9, 2026

(54) VCSEL WITH INTEGRATED ESD PROTECTION

(71) Applicant: II-VI Delaware, Inc., Wilmington, DE (US)

(72) Inventors: Michael Moser, Zurich (CH); Antoine Pissis, Zurich (CH); Evgeny Zibik, Zurich (CH); Elisabetta Corti, Zurich (CH)

(73) Assignee: II-VI DELAWARE, INC., Wilmington, DE (US)

( * ) Notice: Subject to any disclaimer, the term of this patent is extended or adjusted under 35 U.S.C. 154(b) by 545 days.

(21) Appl. No.: 18/119,977

(22) Filed: Mar. 10, 2023

(65) Prior Publication Data

US 2024/0305065 A1    Sep. 12, 2024

(51) Int. Cl.
H01S 5/068        (2006.01)
H01S 5/183        (2006.01)

(52) U.S. Cl.
CPC .......... H01S 5/06825 (2013.01); H01S 5/183 (2013.01); H01S 5/18341 (2013.01); H01S 5/18394 (2013.01)

(58) Field of Classification Search
CPC ... H01S 5/06825; H01S 5/183; H01S 5/18394
See application file for complete search history.

(56) References Cited

U.S. PATENT DOCUMENTS

| | | | |
|---|---|---|---|
| 2003/0185267 A1 | 10/2003 | Hwang et al. | |
| 2014/0233595 A1* | 8/2014 | Murty | H01S 5/06825 |
| | | | 438/29 |
| 2024/0136791 A1* | 4/2024 | Lai | H01S 5/2059 |

FOREIGN PATENT DOCUMENTS

| | | |
|---|---|---|
| JP | 2005-353647 | 12/2005 |
| JP | 2007-512689 | 5/2007 |
| JP | 2010-114214 A | 5/2010 |
| JP | 2020-188206 A | 11/2020 |
| KR | 20040030103 A | 4/2004 |
| WO | 2009078232 A1 | 6/2009 |

OTHER PUBLICATIONS

Japanese Patent Office, Official Communication for Application No. 2023-127563 dated Mar. 13, 2024.
European Office Communication with extended Search Report Appln No. 23183453.2 dated Nov. 29, 2023.
Japanese Office Action for Application No. 2024-186381 dated Nov. 25, 2025, 10 pages.

* cited by examiner

*Primary Examiner* — Yuanda Zhang
(74) *Attorney, Agent, or Firm* — McAndrews, Held & Malloy, Ltd.

(57)        ABSTRACT
A VCSEL device with a lithographic aperture and integrated electrostatic discharge event protection. The VCSEL device may comprise a plurality of layers forming a protective diode outside of the lithographic aperture area, wherein the surface area of the protective diode is larger than the surface area of said lithographic aperture.

11 Claims, 6 Drawing Sheets

300

Ohmic p-contact 120
n-DBR 160a
Tunnel junction layer 330
p-n blocking layer 320
p-type cavity 310
Active region 150
n- type cavity 390
n-DBR 160
Substrate n-GaAs 170
Ohmic n-contact 180

Mesa
LD
110

300

VCSEL WITH INTEGRATED ESD PROTECTION

TECHNICAL FIELD

The present disclosure generally relates to VCSEL with ESD protection.

BACKGROUND

Aspects of the present disclosure relate to VCSEL with integrated ESD protection. Various issues may exist with conventional solutions for VCSEL with ESD protection. In this regard, conventional systems and methods for VCSEL with ESD protection may be costly, cumbersome, and/or inefficient.

Limitations and disadvantages of conventional systems and methods will become apparent to one of skill in the art, through comparison of such approaches with some aspects of the present methods and systems set forth in the remainder of this disclosure with reference to the drawings.

BRIEF SUMMARY OF THE DISCLOSURE

Shown in and/or described in connection with at least one of the figures, and set forth more completely in the claims are VCSEL with ESD protection.

These and other advantages, aspects and novel features of the present disclosure, as well as details of illustrated embodiments thereof, will be more fully understood from the following description and drawings.

BRIEF DESCRIPTION OF THE DRAWINGS

The various features and advantages of the present disclosure may be more readily understood with reference to the following detailed description taken in conjunction with the accompanying drawings, wherein like reference numerals designate like structural elements.

DESCRIPTION

Figure 1:
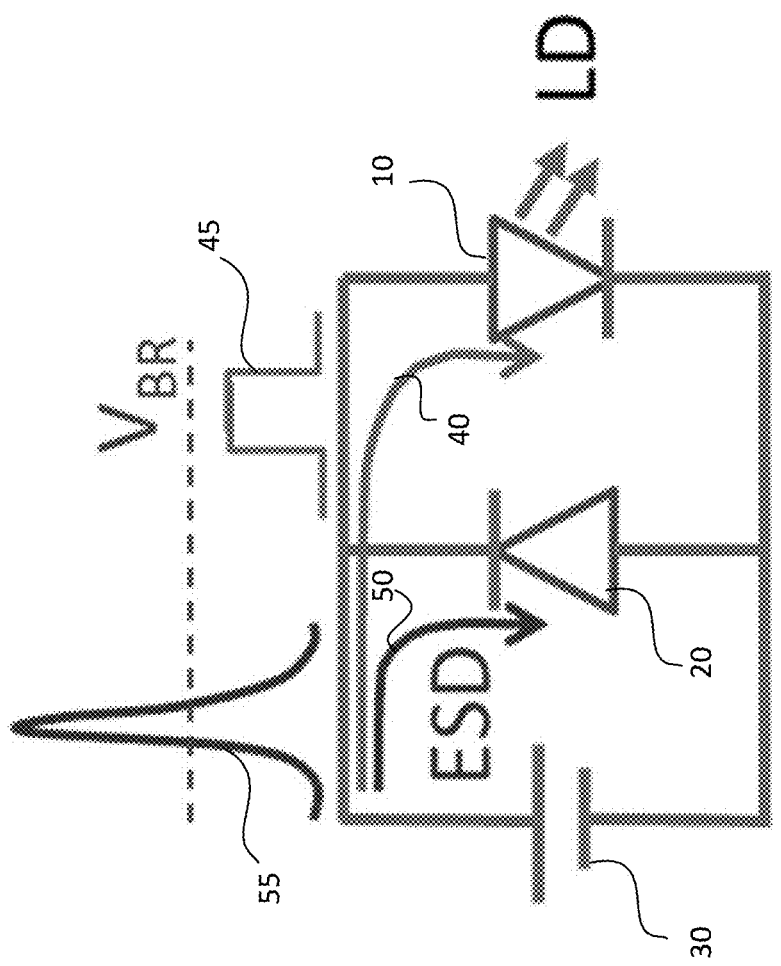
FIG. 1 illustrates an exemplary ESD protection circuit for an ESD-sensitive light emitting diode.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

Referring now to FIG. 1, there is shown an exemplary ESD protection circuit, comprising a light emitting diode (LD) 10, a protection diode 20, a voltage source 30, and an ESD current flow 50 with an associated ESD voltage 55, a normal current flow 40 with associated normal operating voltage 45.

The light emitting diode 10 may be operable to emit light due to a voltage/current that may be applied. The light emitting diode 10 may be a vertical cavity surface emitting laser or VCSEL. A VCSEL may be a type of semiconductor laser diode with laser beam emission perpendicular from a top surface. VCSELs may be used in various laser products.

The ESD protection diode 20 may be coupled to LD 10 as illustrated in FIG. 1. Voltage source 30 may illustrate a device operable to provide a fixed or variable voltage to the electric circuit of FIG. 1. Voltage source 30 depicted may illustrate the source of a normal operating voltage 45 and a normal current flow 40, as well as an ESD current flow 50 and an ESD voltage 55.

VCSELs may be sensitive to ESD events due to their small apertures. That is, LD 10 may be damaged if an excessive voltage and/or current is applied to it, for example by the illustrated voltage source 30. For ESD sensitive devices, such as LD 10, the protection diode 20 may be coupled in parallel to the ESD sensitive laser diode 10, but in reverse direction, as illustrated. The protection diode 20 may be selected or designed so that during normal operation it may be highly resistive and substantially all the current may flow via the ESD sensitive laser diode 10. This is illustrated in FIG. 1 by the normal current flow 40 with associated exemplary normal voltage 45. In normal operation, the normal voltage 45 may be lower than a (reverse) breakthrough voltage VBR associated with the protection diode 20. When an electrostatic discharge occurs, the ESD voltage 55 may exceed the breakthrough voltage VBR and an ESD current flow 50 may flow across the protection diode 20 in reverse direction, as illustrated by ESD current flow 50. Correspondingly, the breakthrough voltage VBR of the protection diode 20 may be desirable at a magnitude that may be higher than the normal operating voltage 45 and lower than a voltage that may cause damage to LD 10. In this way, an ESD-sensitive device, for example LD 10, may be protected from electrostatic discharge by a protection diode 20 coupled to it in reverse and in parallel, as illustrated in FIG. 1. In accordance with normal diode operation, the forward breakdown voltage of the protection diode 20 may be substantially lower than the (reverse) breakdown voltage VBR. In instances where an electrostatic discharge results in a voltage applied in the forward direction of the protection diode 20, LD 10 may be protected because the protection diode 20 may shortcut at a forward voltage substantially lower than the reverse breakthrough voltage, thus preventing damage to the ESD-sensitive device LD 10.

Figure 2:
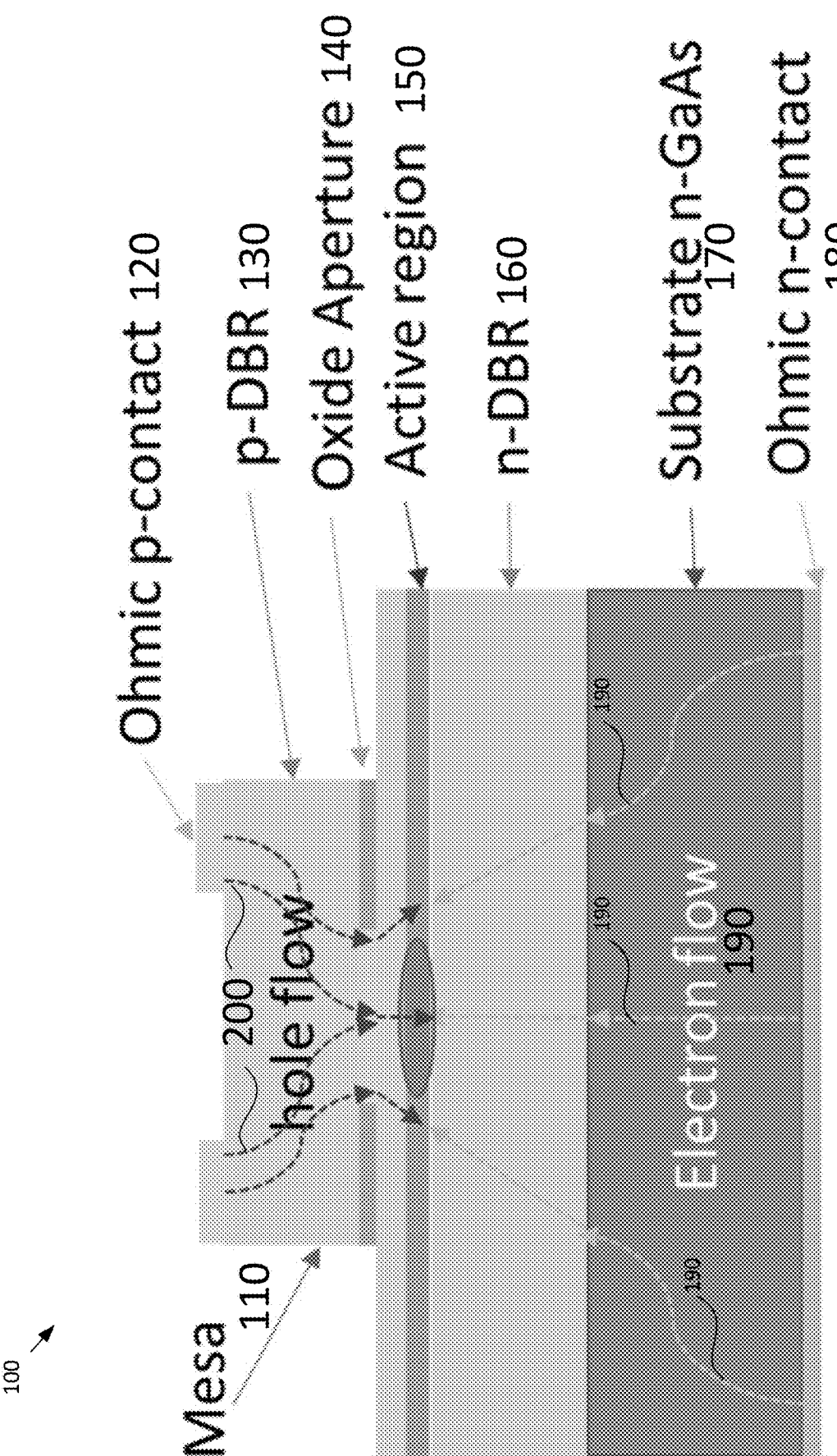
FIG. 2 illustrates a VCSEL with an oxide aperture.

FIG. 2 shows an exemplary cross-section of a VCSEL device 100 with an oxide aperture. There is shown an ohmic n-contact layer 180, a substrate n-GaAs layer 170, an n-DBR layer 160, an active region 150, an oxide aperture layer 140, a p-DBR layer 130, a mesa layer 110, and an ohmic p-contact layer 120. There are further shown electron flow 190 and hole flow 200. The VCSEL device 100 cross-section may be a cross-section of a cylindrical structure with a round, elliptical, rectangular, or any other shape cross-section, for example.

The VCSEL 100 may be made using lithographic semiconductor manufacturing processes, for example. The ohmic n-contact 180 may be operable as an electric coupling contact for a negative voltage terminal. Similarly, the ohmic p-contact 120 may be operable as an electric coupling contact for a positive voltage terminal.

The p-DBR 130 may be p-type distributed Bragg reflector (DBR). The n-DBR 160 may be an n-type distributed Bragg reflector. The p-DBR 130 and the n-DBR 160 may be operable as the resonance mirrors of the laser. n-type may refer to doping with an impurity to provide additional electrons, whereas p-type may refer to doping with an impurity to provide additional holes.

The oxide aperture 140 may be operable to permit emission of light generated by the VCSEL 100 perpendicular to the active region 150. The oxide layer may confine the current flow (200/190) to the aperture region 140, as illustrated in FIG. 2. The active region 150 may comprise suitable energy levels so that the injection of energy may provide an excess of atoms in an excited state between a resonator system that may be formed between the p-DBR 130 and n-DBR 160 mirrors, permitting the stimulated emission of light. The active region 150 may comprise quantum wells, quantum dashes, or quantum dots.

The substrate n-GaAs 170 may be an n-type gallium arsenide (GaAs) substrate layer. In accordance with various embodiments of the patent, the substrate 170 may be any suitable material, including, but not limited to, indium phosphide (InP), gallium nitride (GaN), silicon (Si), and silicon carbide (SiC).

The mesa 110 may be an area on a semiconductor wafer where the semiconductor has not been etched away, resulting in a mesa 110 rising above the surrounding area.

In the situation of an electrostatic discharge (ESD) event, the electric discharge current flow may occur through the area of the oxide aperture 140, as illustrated by the hole flow 200 and the electron flow 190 in FIG. 2. Because the area of the aperture 140 may be restricted (compared to the area of the mesa 110), an electric discharge current density in the oxide aperture 140 area may be high and may potentially damage the active region layer 150 of the VCSEL 100.

Figure 3:
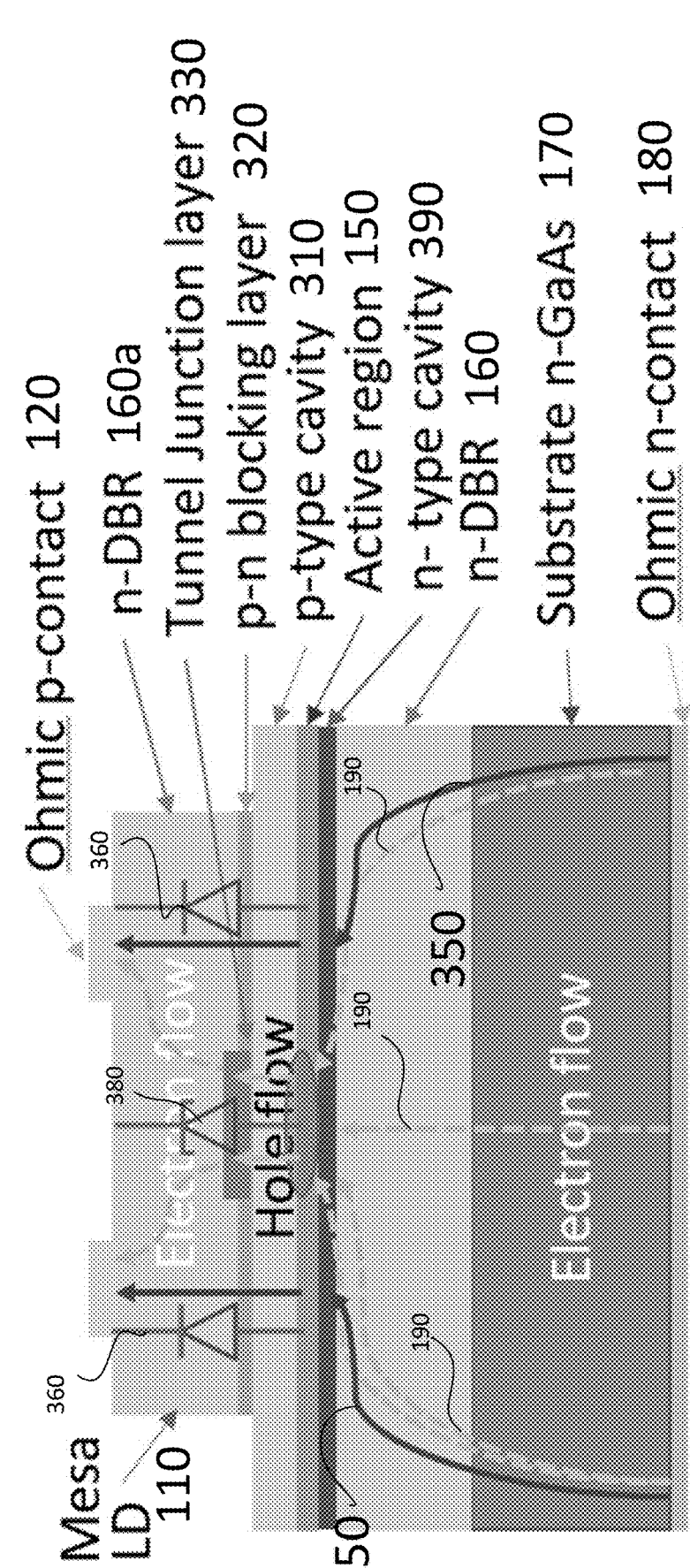
FIG. 3 illustrates a VCSEL with a lithographic tunnel junction aperture and integrated ESD-protective diode functionality.

Accordingly, it may be advantageous to integrate a structure similar to an ESD protection diode 20 directly into a VCSEL, as will be illustrated in FIG. 3.

FIG. 3 shows an exemplary tunnel junction configuration VCSEL with an integrated protection diode structure. Referring to FIG. 3, there is shown a VCSEL 300 in a tunnel junction configuration. The VCSEL may comprise a mesa 110, an ohmic p-contact 120, an ohmic n-contact 180, an n-DBR 160a, an active region 150, an n-DBR 160, and a substrate n-GaAs 170 layer. Same reference numbers may refer to similar layers as in FIG. 2. The n-DBR 160a may be similar to n-DBR 160. There is shown an electron flow 190. There is shown an electronic discharge flow 350. There is shown an illustrative protection diode symbol 360 and a tunnel diode symbol 380. The protection diode symbol 360 may symbolize the n-p junction diode formed by the p-type cavity 310/p-n blocking layer 320 and the n-DBR 160a. The tunnel diode 380 symbol illustrates the tunnel diode that may be formed by the p-type cavity 310/p-n blocking layer 320/tunnel junction layer 330 and the n-DBR 160a layers.

There is further shown a p-type cavity 310, a p-n blocking layer 320 and a tunnel junction layer 330. The p-n blocking layer 320 may be operable to block current flow during normal operation (i.e., lower voltages of e.g. less than 5V). There is also shown an n-type cavity 390.

A lithographic aperture VCSEL 300 may rely on an electrically conductive aperture for the current and optical mode confinement (formed by the tunnel junction layer 330), whereas the surrounding area is made non-conductive electrically. This may be achieved by growing first a bottom n-DBR mirror 160, and n-cavity 390, active region 150 (comprising Quantum wells, Quantum dashes or Quantum Dots) and a partial p-cavity 310. The tunnel junction layer 330 may comprise a highly doped (e.g. $>10^{19}$ cm$^{-3}$) p++ layer and a highly doped (e.g. $>10^{19}$ cm$^{-3}$) n++ layer. The aperture may be defined in the tunnel junction layer 330. To form the aperture in the tunnel junction layer 330, the n++ layer (from which the tunnel junction layer 330 is formed) may be removed/etched outside the lithographic aperture and the wafer is overgrown with the remaining cavity, which may be n-type doped (e.g. between $10^{17}$ and few×$10^{18}$ cm$^{-3}$), and is top n-DBR mirror 160a. In this case the current flow and optical mode confinement may be provided by the tunnel junction. Outside the aperture formed by the tunnel junction layer 330, the current may be blocked due to the p-n junction formed by the p-n blocking layer 320/p-type cavity 310 and the n-DBR 160a being in the reverse direction.

In FIG. 3, during normal operation the voltage applied to the VCSEL 300 may be well below the breakdown voltage of the blocking p-n junction layer and hence the current flow during the operation is restricted to the tunnel junction aperture 330. The blocking p-n junction may be formed between the n-DBR 160a and the p-n blocking layer 320/p-type cavity 310. The current flow may be illustrated by the electron flow 190 by dashed arrows. In the event of an electrostatic discharge, the voltage will exceed the breakdown voltage of the p-n blocking layer (n-DBR 160a and *p-n* blocking layer 320/p-type cavity 310) and hence the electrostatic discharge current 350 (illustrated by solid arrows) may mostly flow around the tunnel junction 330, because the available conductive area is much larger during diode breakdown. In this case, the current density in the active region underneath of tunnel junction layer 330 may be correspondingly reduced. In accordance with various embodiments of the patent, the layers formed in VCSEL 300 by the mesa 110 and lower layers are enabled to form protective diodes 360 and 370 (not symbolically illustrated, see also FIG. 4). The protective diodes may be formed between the n-DBR 160a and the p-n blocking layer 320/p-type cavity 310.

For the ESD protection to be efficient, the current blocking p-n junction area may be as large as practical, as limited by mesa 110 surface area. In this case an ESD current may be distributed across a corresponding mesa 110 surface area and may result in reduced current density and thus less damage potential. The breakdown voltage of the p-n blocking layer 320 may be advantageously above 5V. The breakdown voltage may be adjusted by suitable choice of the doping and thickness of p-type (p-n blocking layer 320/p-type cavity 310) and n-type layers (n-DBR 160a). In some instances, additional layers may be on top of the p-n blocking layer 320. Also, in some instances, n-DBR 160a may comprise additional layers with different doping to form a non-uniformly doped n-DBR 160a. Thus, in case of an n-p-n blocking configuration illustrated in FIG. 3 (from n-DBR 160a, p-n blocking layer 320/p-type cavity 310/active region 150, and n-DBR 160), where the bottom n-DBR 160 and the lower half of the cavity below the active region 150 may be n-doped, the second half of the cavity above the active region 150 may be p-doped and the top n-DBR 160a may be n-doped. The combined thickness of the p-doped layers may preferably be >50 nm and doping may be desirable in the range between $10^{17}$ cm$^{-3}$ and $<10^{19}$ cm$^{-3}$, for example. The doping in the n-DBR 160a may be $<10^{19}$ cm$^{-3}$ to reduce quantum tunnelling of carriers between p-doped and n-doped layers, which may lead to inefficient current blocking. On the other hand, the breakdown voltage of the n-p-n ESD protective diode (formed by n-DBR 160a, p-n blocking layer 320/p-type cavity 310/active region 150 and n-DBR 160), may be selected to be <50 V to avoid potential damage to the lithographic aperture (at tunnel junction layer 330) in case of an ESD event and before the ESD protective diode 360 may open in reverse mode.

Further, using the n-DBR 160a mirror at the top of VCSEL 300 provides improved electrical conductivity compared to a p-DBR 130 as illustrated in FIG. 2 for a VCSEL 100 with oxide aperture. This improved electrical conductivity may reduce heat generated in an ESD event close to sensitive areas of the VCSEL 300 and thus provide additional protection.

Figure 4:
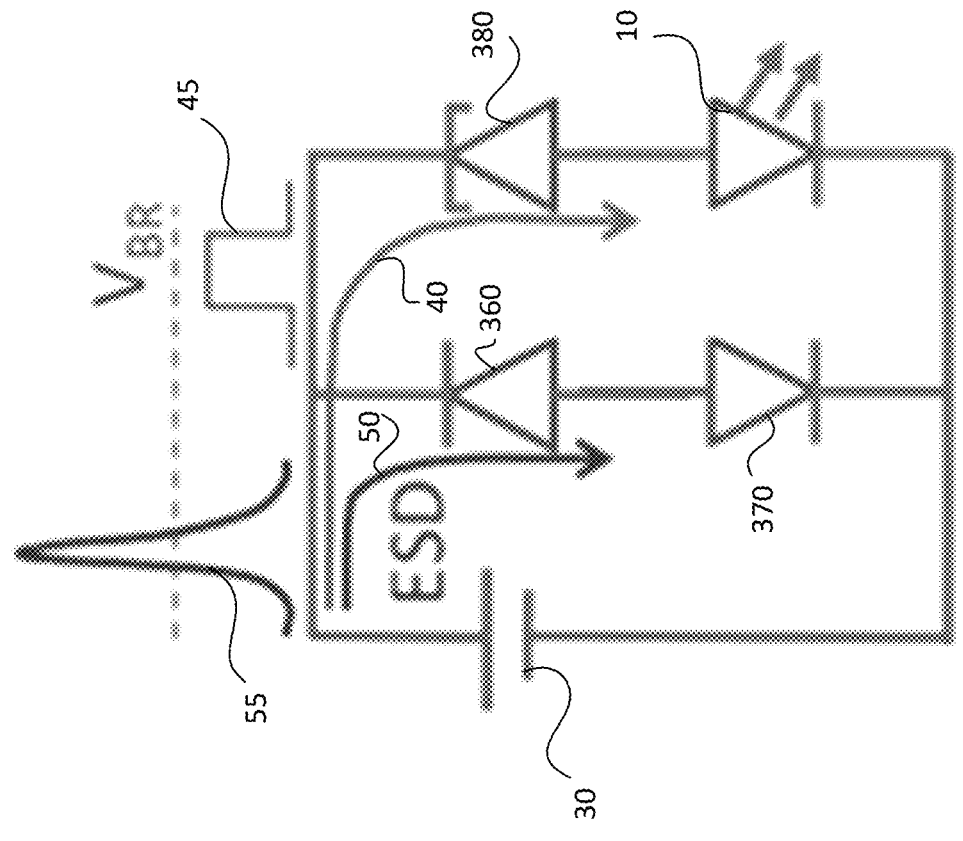
FIG. 4 illustrates an equivalent circuit diagram illustrating the function of a VCSEL according to FIG. 3.

FIG. 4 shows an equivalent circuit diagram to the VCSEL structure of FIG. 3, illustrating the diode arrangements formed by the layers in FIG. 3. There is shown a voltage/current source 30, an ESD voltage 55, a normal operating voltage 45, an ESD current 50, a normal operation current 40, protection diodes 360, 370, a tunnel diode 380, and a light-emitting diode 10. Same number references may be similar to elements in earlier figures.

The protection diode symbol 360 may symbolize the p-n junction diode formed by the p-type cavity 310/p-n blocking layer 320 and the n-DBR 160a. The tunnel diode 380 symbol illustrates the tunnel diode that may be formed by the p-type cavity 310/p-n blocking layer 320/tunnel junction layer 330 and the n-DBR 160a layers. The protection diode 370 may symbolize the p-n junction formed by the p-cavity 320/active region 150 and the n-DBR 160 (not symbolically depicted in FIG. 3).

In normal operation, the operating voltage 45 may be below the breakdown voltage VBR of the protection diode 360 (or 370 in reverse direction, not illustrated). The normal operating current 40 may flow effectively only through tunnel diode 380 and LD 10. If an electrostatic discharge event occurs and the ESD voltage 55 exceeds the breakdown voltage VBR, the protection diode 360 may become conductive and the ESD current 50 may largely flow through the protection diodes 360, 370. Thus, in case of an ESD event, the protection diodes 360, 370 may effectively short-circuit and thus protect the tunnel diode 380 and the LD 10 from excessive ESD voltage/current.

Figure 5:
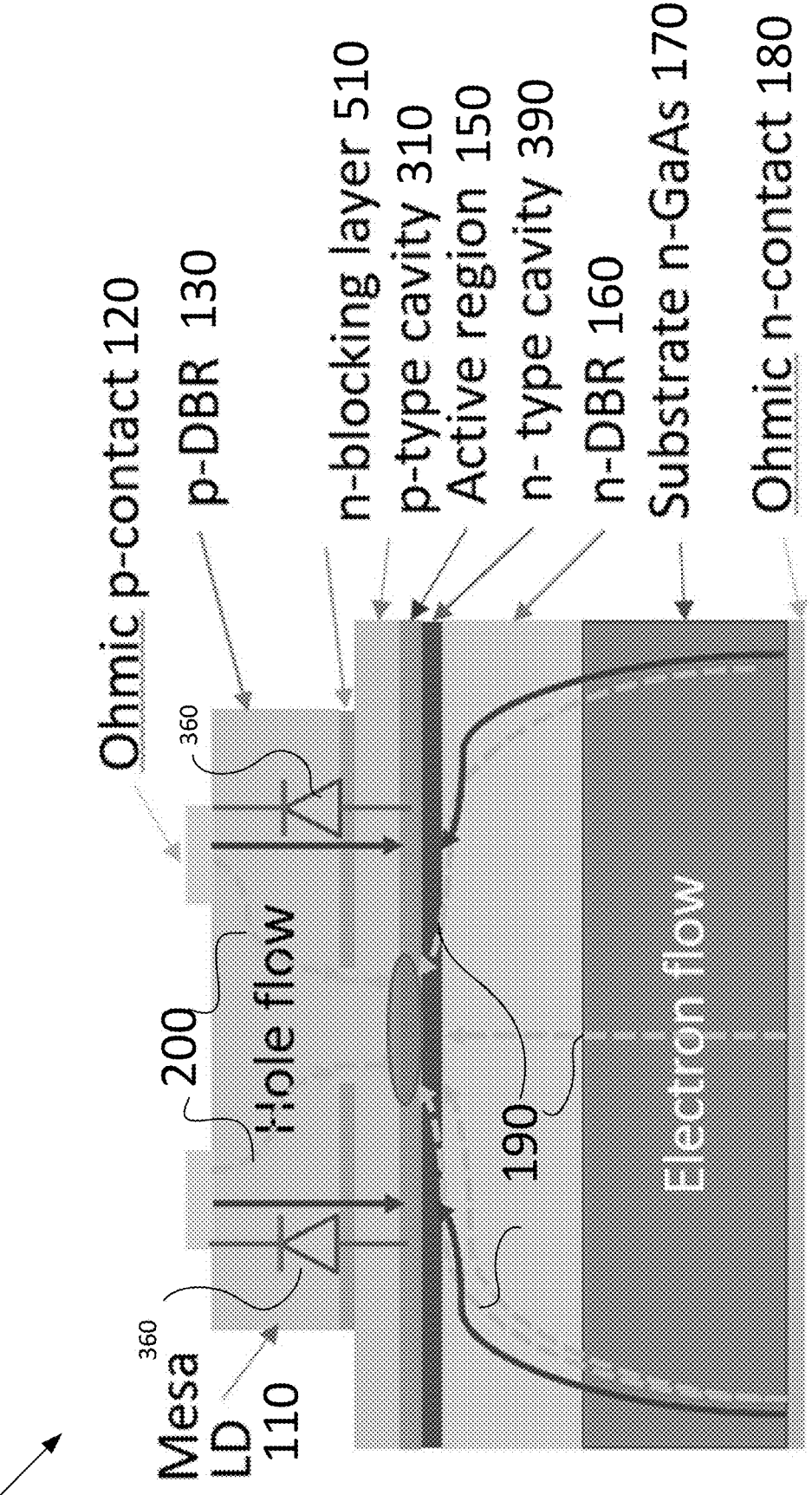
FIG. 5 illustrates a VCSEL with a lithographic aperture defined by an opening in a n-blocking layer with integrated ESD-protective diode functionality.

FIG. 5 illustrates a VCSEL diode based on a p-n-p current blocking configuration with integrated ESD protection diode. FIG. 5 shows VCSEL 500 comprising a mesa 110, an ohmic p-contact 120, a p-DBR 130, an n-blocking layer 510, a p-type cavity 310, an active region 150, an n-DBR 160, a n-GaAs substrate 170, an ohmic n-contact 180. There is further shown electron flow 190 and hole flow 200. There is shown a symbolic protection diode 360 as formed by the p-DBR 130 layer, the n-blocking layer 510, and the p-type cavity 310. There is also shown an n-type cavity 390. Same reference numbers may refer to similar elements as in previous figures.

As illustrated in FIG. 5, ESD protection may also be introduced into the lithographic aperture using the current n-blocking layer 510. In VCSEL 500, the n-doped current blocking layer 510 may be grown during a first epitaxial step. This layer 510 may become part of the ESD protective diode 360 illustrated. During the wafer fabrication process the lithographic aperture may be defined by etching through the n-doped layer 510, as shown in FIG. 5. After definition of the lithographic aperture, the wafer over the n-blocking layer 510 may be overgrown with the top p-doped p-DBR 130 mirror. Thus, in the region of the lithographic aperture, the n-doped layer 510 may be etched, allowing the current flow in normal operation directly from the p-doped p-type cavity 310 into the p-doped p-DBR 130 mirror. The lithographic aperture may also provide the optical mode confinement of the VCSEL 500.

In the embodiment of the patent in FIG. 5, during normal operation the voltage applied to the VCSEL 500 is below the breakdown voltage of the n-blocking layer 510 and hence the normal current flow may be restricted to the aperture opened in the p-n-p layering (illustrated by yellow dashed arrows). When an ESD event occurs, the higher voltage may exceed the breakdown voltage of the n-blocking layer 510 and thus the ESD current (red solid arrow) may flow outside of the aperture. Because the area of the n-blocking layer 510 around the aperture is typically significantly larger than the aperture area itself, the ESD current will distribute over a much larger surface area, as effectively defined by the mesa cross-section area. This functionality may be illustrated in FIG. 6.

Figure 6:
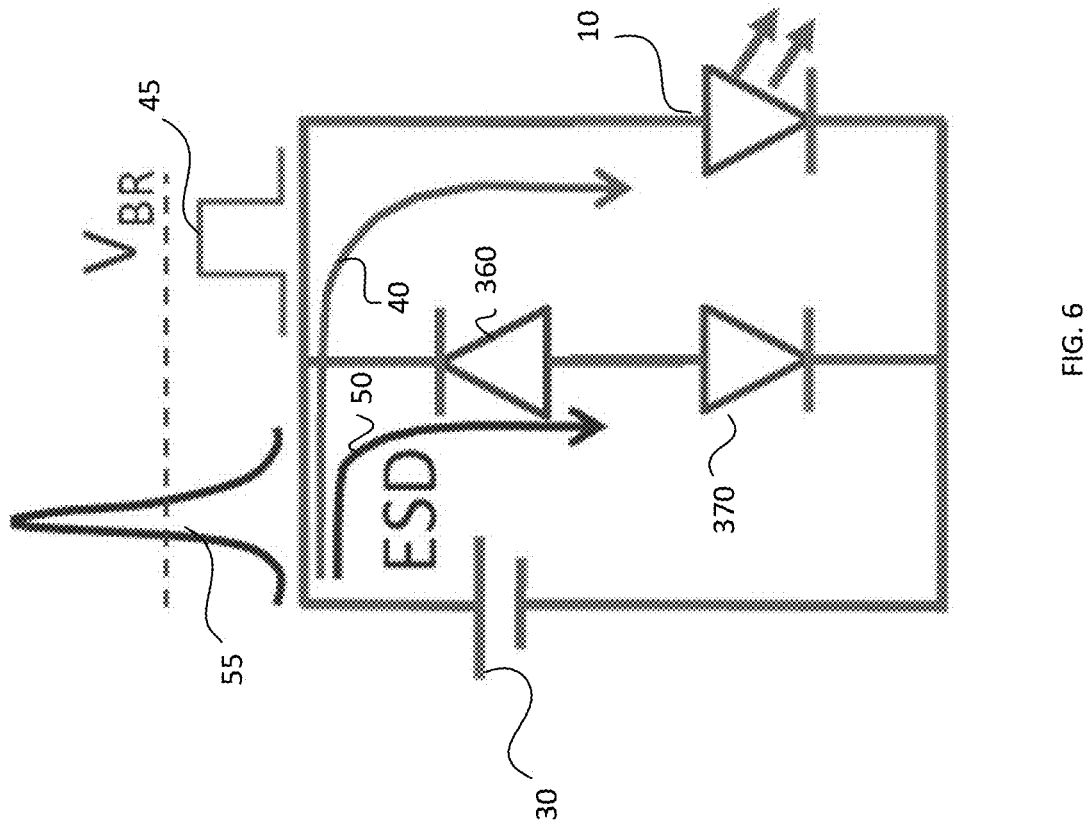
FIG. 6 illustrates an equivalent circuit diagram illustrating the function of a VCSEL according to FIG. 5

FIG. 6 illustrates an equivalent circuit diagram of a VCSEL 500. There is shown a voltage/current source 30, an ESD voltage 55, a normal operating voltage 45, an ESD current flow 50, a normal operation current 40, protection diodes 360, 370, and a light-emitting diode 10. Same reference numbers may refer to similar elements shown in other figures.

In normal operation, i.e. when the operating voltage 45 is below the breakdown voltage VBR, the protection diodes 360, 370 may block a current flow and the normal current 40 may flow via the LD 10. In this case, the current will flow through the aperture area, as illustrated by the dashed arrows in FIG. 5. When an ESD event occurs and the ESD voltage 55 may exceed the breakdown voltage VBR, the protection diodes 360 and 370 effectively short-circuit and permit an ESD current 50 to flow through the protection diodes 360, 370. This protects the LD 10 from current and voltage spikes that may damage it.

Accordingly, the mesa 110 cross-sectional area may be selected as large as practical so as to minimize the ESD event current density through the aperture and thus protect the VCSEL 500. In other words, the n-blocking layer 510 surface area may be made large.

In accordance with various embodiments of the patent, the breakdown voltage of the n-blocking layer 510 may be preferably greater than 5V, for example by selecting desirable doping and thicknesses of the p-type and n-type layers in FIG. 5.

In case of a p-n-p blocking diode configuration illustrated in FIG. 5, formed by the p-type cavity 310 above the active region 150, the n-blocking layer 510 and the p-DBR 130 mirror, the thickness of the n-blocking layer 510 may be >50 nm and doping may be in the range between $10^{17}$ cm$^{-3}$ and $10^{19}$ cm$^{-3}$. The doping in the p-DBR layer 130 may be <$10^{19}$ cm$^{-3}$. Such doping levels may be advantageous to prevent quantum tunneling of carriers between n-doped and p-doped layers, which may lead to inefficient current blocking. The breakdown voltage VBR of the p-n-p ESD protective diode 360, 370, may be designed to be <50 V to prevent damage to the lithographic aperture in case of an ESD event.

The structures disclosed in FIG. 3 and FIG. 5 may be manufactured using a using 2 step epitaxy method with intermediate lithographic steps, for example.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. A VCSEL device with a lithographic aperture and electrostatic discharge event protection, the VCSEL device comprising:

a plurality of layers forming a protective diode outside of the lithographic aperture area, wherein a surface area of said protective diode is larger than the surface area of said lithographic aperture, wherein said plurality of layers form an n-p-n junction to form said protective diode, and wherein a top n-DBR layer of said n-p-n junction over a tunnel junction is highly conductive to thermally protect the VCSEL in an electrostatic discharge event.

2. The device according to claim 1, wherein said protective diode is in reverse mode during normal operation and blocks current flow in areas outside of said lithographic aperture.

3. The device according to claim 1, wherein said protective diode is in reverse mode and breaks down during an electrostatic discharge event and allows current flow in areas outside of said lithographic aperture area.

4. The device according to claim 1, wherein said lithographic aperture is defined by a tunnel junction layer.

5. The device according to claim 1, wherein said n-p-n junction has a reverse breakdown voltage between 5 and 50 volts, or between 3 and 100 volts.

6. The device according to claim 1, wherein a p-n blocking layer of said plurality of layers forming a protective diode has a reverse breakdown voltage above 5 volts, or above 3 volts.

7. The device according to claim 1, wherein said top n-DBR layer of said n-p-n junction has a higher conductivity than a p-type cavity.

8. The device according to claim 1, wherein said lithographic aperture is defined by an opening in an n-blocking layer.

9. The device according to claim 1, wherein said plurality of layers form a p-n-p junction to form said protective diode.

10. The device according to claim 9, wherein said p-n-p junction may have a reverse breakdown voltage between 5 and 50 volts, or between 3 and 100 volts.

11. The device according to claim 1, wherein an n-blocking layer of said plurality of layers forming a protective diode has a reverse breakdown voltage above 5 volts, or above 3 volts.

* * * * *